(12) United States Patent
Park et al.

(10) Patent No.: US 9,685,606 B2
(45) Date of Patent: Jun. 20, 2017

(54) PATTERNING METHODS, METHODS OF FABRICATING SEMICONDUCTOR DEVICES USING THE SAME, AND SEMICONDUCTOR DEVICES FABRICATED THEREBY

(71) Applicant: Samsung Electronics Co., Ltd., Suwon-Si, Gyeonggi-do (KR)

(72) Inventors: Jongchul Park, Seongnam-si (KR); Hyungjoon Kwon, Seongnam-si (KR); Inho Kim, Suwon-si (KR); Jongsoon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 14/970,163

(22) Filed: Dec. 15, 2015

(65) Prior Publication Data

US 2016/0218280 A1 Jul. 28, 2016

(30) Foreign Application Priority Data

Jan. 23, 2015 (KR) .................. 10-2015-0011319

(51) Int. Cl.
*H01L 21/00* (2006.01)
*H01L 43/12* (2006.01)
(Continued)

(52) U.S. Cl.
CPC ........ *H01L 43/12* (2013.01); *H01L 21/32131* (2013.01); *H01L 27/1087* (2013.01); *H01L 27/222* (2013.01); *H01L 43/08* (2013.01)

(58) Field of Classification Search
CPC ....... H01L 43/12; H01L 43/08; H01L 27/222; H01L 27/1087
See application file for complete search history.

(56) References Cited

U.S. PATENT DOCUMENTS 5,607,599 A 3/1997 Ichihara et al.
8,083,962 B2 * 12/2011 Lee .................. H01L 21/0337
216/17
(Continued)

OTHER PUBLICATIONS

Stauss et al., MicroFab, The Cutting Edge of Ion Beam Etch and Thin Film Technology, http://www.microfabnh.com/ion_beam_etch-technology.php, pp. 1/4-4/4.
(Continued)

*Primary Examiner* — Zandra Smith
*Assistant Examiner* — John M Parker
(74) *Attorney, Agent, or Firm* — Ward and Smith, P.A.

(57) ABSTRACT

A patterning method includes forming an etch-target layer on a substrate, forming mask patterns on the etch-target layer, and etching the etch-target layer using the mask patterns as an etch mask to form patterns spaced apart from each other. The etching process of the etch-target layer includes irradiating the etch-target layer with an ion beam, whose incident energy ranges from 600 eV to 10 keV. A recess region is formed in the etch-target layer between the mask patterns, and the ion beam is incident onto a bottom surface of the recess region at a first angle with respect to a top surface of the substrate and is incident onto an inner side surface of the recess region at a second angle with respect to the inner side surface of the recess region. The first angle ranges from 50° to 90° and the second angle ranges from 0° to 40°.

19 Claims, 14 Drawing Sheets

(51) Int. Cl.
*H01L 21/3213* (2006.01)
*H01L 27/22* (2006.01)
*H01L 27/108* (2006.01)
*H01L 43/08* (2006.01)

(56) References Cited

U.S. PATENT DOCUMENTS

| | | |
|---|---|---|
| 8,728,333 B2 | 5/2014 | Wang et al. |
| 8,865,008 B2 | 10/2014 | Ding et al. |
| 2013/0029431 A1 | 1/2013 | Takahashi et al. |
| 2013/0248355 A1 | 9/2013 | Ohsawa et al. |
| 2013/0307099 A1 | 11/2013 | Kitagawa et al. |
| 2013/0316536 A1* | 11/2013 | Seto .................... H01L 21/2633 438/689 |
| 2014/0084402 A1 | 3/2014 | Shimomura et al. |
| 2014/0170776 A1* | 6/2014 | Satoh ...................... H01L 43/12 438/3 |
| 2014/0227801 A1 | 8/2014 | Hsu et al. |
| 2014/0227804 A1 | 8/2014 | Hsu et al. |
| 2014/0248718 A1 | 9/2014 | Kim et al. |
| 2016/0149123 A1* | 5/2016 | Park .................. H01J 37/32357 438/3 |

OTHER PUBLICATIONS

Etch System, 4Wave. Ion Beam. Milling, Reactive Ion Milling, Plasma Etching, Dry Etch, Ion Beam Etching, Reactive Ion Etching, http://www.4waveinc.com/es.html, 1/3-3/3.

Doctoral thesis by Carl-Fredrik Carlstrom, Ion Beam Etching of InP Based Materials, Laboratory of Semiconductor Materials, Department of Microelectronics and Information Technology, Royal Institute of Technology, Kista, Sweden, Stockholm 2001, 57 pages.

* cited by examiner

PATTERNING METHODS, METHODS OF FABRICATING SEMICONDUCTOR DEVICES USING THE SAME, AND SEMICONDUCTOR DEVICES FABRICATED THEREBY

CROSS-REFERENCE TO RELATED APPLICATIONS

This U.S. non-provisional patent application claims priority under 35 U.S.C. §119 to Korean Patent Application No. 10-2015-0011319, filed on Jan. 23, 2015, in the Korean Intellectual Property Office, the disclosure of which is hereby incorporated by reference.

FIELD

The inventive concepts relate to patterning methods that use an ion beam, methods of fabricating a semiconductor device using the same, and semiconductor devices fabricated thereby.

BACKGROUND

Due to an increasing demand for electronic devices with increased speed and/or reduced power consumption, semiconductor devices require faster operating speeds and/or lower operating voltages. Magnetic memory devices have been suggested to satisfy such requirements. For example, the magnetic memory device can provide technical advantages, such as reduced latency and/or non-volatility. As a result, magnetic memory devices are emerging as next-generation memory devices.

A magnetic memory device includes a magnetic tunnel junction (MTJ). A magnetic tunnel junction may include two magnetic layers and a tunnel barrier layer interposed therebetween. Resistance of the magnetic tunnel junction may vary depending on magnetization directions of the magnetic layers. For example, the resistance of the magnetic tunnel junction is higher when magnetization directions of the magnetic layers are anti-parallel to each other than when they are parallel to each other. Such a difference in resistance can be used for data storing operations of the magnetic memory device. However, more research is still needed to mass-produce a magnetic memory device and satisfy demands for a magnetic memory device with higher integration density and lower power consumption properties. For example, forming a magnetic tunnel junction requires precise patterning of features on a substrate.

SUMMARY

Some embodiments of the inventive concepts provide patterning methods for removing an etch residue.

Other embodiments of the inventive concepts provide highly-reliable semiconductor devices and methods of fabricating the same.

According to some embodiments of the inventive concept, a method of forming patterns may include forming an etch-target layer on a substrate, forming mask patterns on the etch-target layer, and etching the etch-target layer using the mask patterns as an etch mask to form patterns spaced apart from each other. The etching process of the etch-target layer may include irradiating the etch-target layer with an ion beam, whose incident energy ranges from about 600 eV to about 10 keV.

The etching process may include forming a recess region in the etch-target layer between the mask patterns, and the ion beam may be incident onto a bottom surface of the recess region at a first angle and may be incident onto an inner side surface of the recess region at a second angle less than the first angle. The first angle may range from about 50° to about 90°, and the second angle may range from about 0° to about 40°.

In some embodiments, the ion beam may have an incident energy greater than 1 keV. In some embodiments, the incident energy of the ion beam may be greater than 2 keV, and in some embodiments, the incident energy of the ion beam may be greater than 5 keV.

In some embodiments, the inner side surface of the recess region may be inclined at a third angle with respect to a top surface of the substrate. Here, the second angle may be expressed by $\theta 2=180°-\theta 1-\theta 3$, where $\theta 1$, $\theta 2$, and $\theta 3$ denote the first, second, and third angles, respectively.

In some embodiments, the recess region may have a width that increases in the direction away from the top surface of the substrate, when viewed in a sectional view.

In some embodiments, the etch-target layer may include a conductive material.

In some embodiments, the etch-target layer may include a metallic element.

In some embodiments, the ion beam may include positive ions of argon (Ar).

According to some embodiments of the inventive concept, a method of fabricating a semiconductor device may include forming a magnetic tunnel junction layer on a substrate, forming mask patterns on the magnetic tunnel junction layer, and etching the magnetic tunnel junction layer using the mask patterns as an etch mask to form magnetic tunnel junction patterns spaced apart from each other. The etching process of the magnetic tunnel junction layer may include irradiating the magnetic tunnel junction layer with an ion beam, whose incident, energy ranges from about 600 eV to about 10 keV.

The etching process may include forming a recess region in the magnetic tunnel junction layer between the mask patterns, and the ion beam may be incident into a bottom surface of the recess region at a first angle and may be incident into an inner side surface of the recess region at a second angle less than the first angle. The first angle may range from about 50° to about 90°, and the second angle may range from about 0° to about 40°.

In some embodiments, the magnetic tunnel junction layer may include a first magnetic layer and a second magnetic layer, which may be stacked on the substrate, and a tunnel barrier layer interposed between the first and second magnetic layers.

In some embodiments, the ion beam may have an incident energy greater than 1 keV. In some embodiments, the incident energy of the on beam may be greater than 2 keV, and in some embodiments, the incident energy of the ion beam may be greater than 5 keV.

In some embodiments, the mask patterns may include a conductive material.

In some embodiments, the inner side surface of the recess region may be inclined at a third angle with respect to a top surface of the substrate. Here, the second angle may be expressed by $\theta 2=180°-\theta 1-\theta 3$, where $\theta 1$, $\theta 2$, and $\theta 3$ denote the first, second, and third angles, respectively.

In some embodiments, the ion beam may include positive ions of argon (Ar).

In some embodiments, each of the magnetic tunnel junction patterns may include a first magnetic pattern and a second magnetic pattern, which may be stacked on the substrate, and a tunnel barrier pattern interposed between the first and second magnetic patterns, and each of the first and second magnetic patterns may have a magnetization direction perpendicular to an interface between the second magnetic pattern and the tunnel barrier pattern.

In some embodiments, each of the magnetic tunnel junction patterns may include a first magnetic pattern and a second magnetic pattern, which may be stacked on the substrate, and a tunnel barrier pattern interposed between the first and second magnetic patterns, and each of the first and second magnetic patterns may have a magnetization direction parallel to an interface between the second magnetic pattern and the tunnel barrier pattern.

According to some embodiments of the inventive concept, a semiconductor device may include an upper electrode on a substrate, and a magnetic tunnel junction pattern between the substrate and the upper electrode. When viewed in a sectional view, a maximum width of the upper electrode may be larger than that of the magnetic tunnel junction pattern, and the upper electrode may have a width increasing in a direction away from a top surface of the substrate.

In some embodiments, the magnetic tunnel junction pattern may have a side surface perpendicular to the top surface of the substrate.

In some embodiments, when viewed in a sectional view, the magnetic tunnel junction pattern may have a width increasing in the direction away from the top surface of the substrate.

In some embodiments, the magnetic tunnel junction pattern may include a first magnetic pattern and a second magnetic pattern, which may be stacked on the substrate, and a tunnel barrier pattern interposed between the first and second magnetic patterns, and each of the first and second magnetic patterns may have a magnetization direction perpendicular to an interface between the second magnetic pattern and the tunnel barrier pattern.

In some embodiments, the magnetic tunnel junction pattern may include a first magnetic pattern and a second magnetic pattern, which may be stacked on the substrate, and a tunnel barrier pattern interposed between the first and second magnetic patterns, and each of the first and second magnetic patterns may have a magnetization direction parallel to an interface between the second magnetic pattern and the tunnel barrier pattern.

In some embodiments, the device may further include a lower electrode between the substrate and the magnetic tunnel junction pattern, a selection element provided on the substrate and electrically connected to the magnetic tunnel junction pattern through the lower electrode, and a bit line provided on the substrate and electrically connected to the magnetic tunnel junction pattern through the upper electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
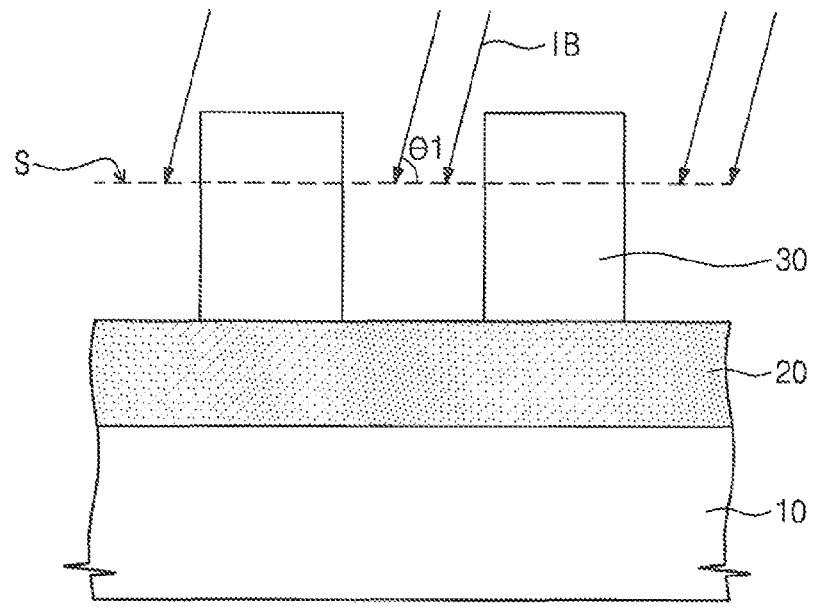
FIGS. 1, 2, and 5 are sectional views illustrating a patterning method according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concepts will now be described more fully with reference to the accompanying drawings, in which example embodiments are shown. The inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Examples of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

Figure 2:
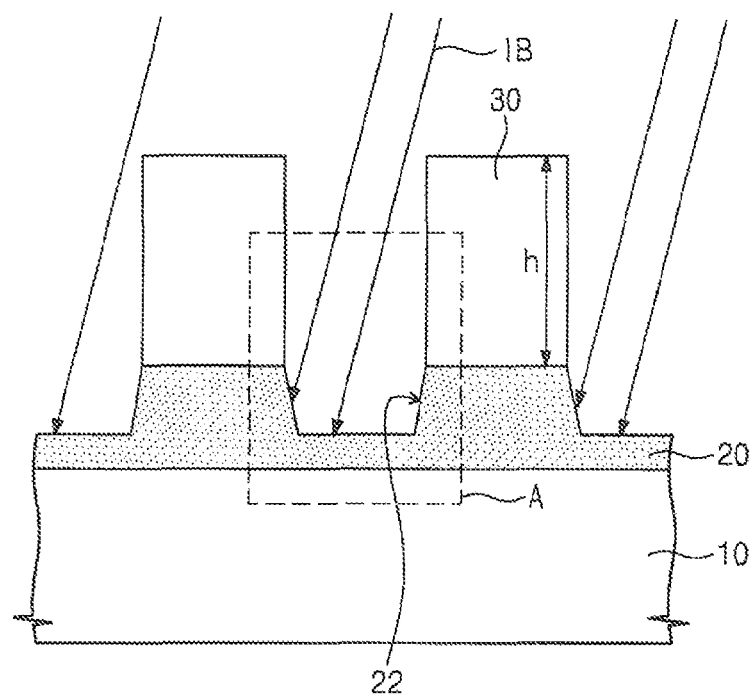
Figure 3:
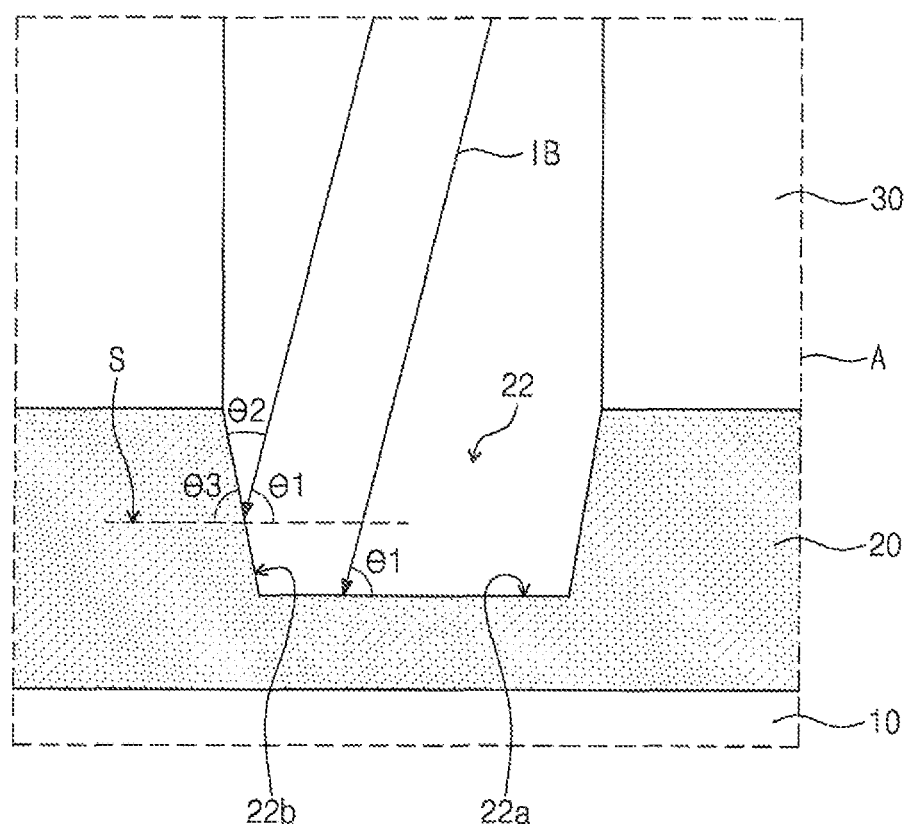
FIGS. 3 and 4 are enlarged sectional views of a portion A of FIG. 2.
Figure 4:
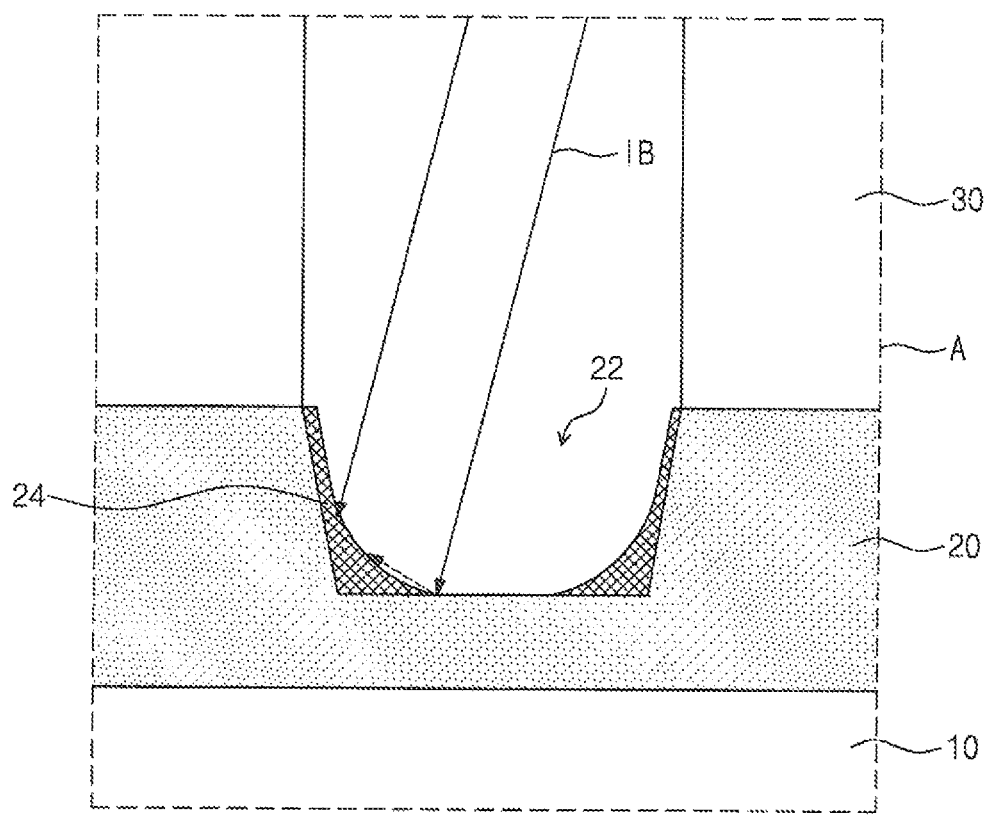
Figure 5:
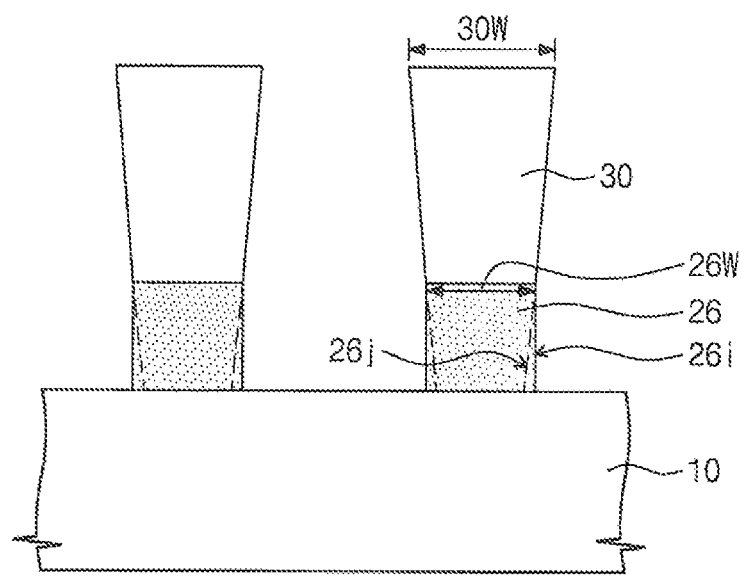

FIGS. 1, 2, and 5 are sectional views illustrating a patterning method according to example embodiments of the inventive concept, and FIGS. 3 and 4 are enlarged sectional views of a portion A of FIG. 2.

Referring to FIG. 1, an etch-target layer 20 may be formed on a substrate 10. The substrate 10 may include a selection element, such as a transistor or a diode. The etch-target layer 20 may include a conductive material. In some embodiments, the etch-target layer 20 may include a metallic element, however, the etch-target layer need not include a metal or be conductive.

Mask patterns 30 may be formed on the etch-target layer 20, and an etching process using the mask patterns 30 as an etch mask may be performed on the etch-target layer 20. The etching process may be performed using a sputtering technique. In detail, during the etching process, an ion beam IB may be directed towards the substrate 10 including the mask patterns 30. The ion beam IB may include, for example, a beam of positively charged of argon (Ar) ions. The ion beam IB may be incident into a surface of the etch-target layer 20 with an angle (hereinafter, first angle) of θ1 with respect to a reference line S parallel to a top surface of the substrate 10. During the etching process, the substrate 10 may be rotated about a rotating axis normal to the top surface of the substrate 10, and this makes it possible to symmetrically etch the etch-target layer 20 between the mask patterns 30.

Referring to FIGS. 2 through 5, as a result of the etching process, the etch-target layer 20 may be etched to form patterns 26 that are spaced apart from each other on the substrate 10. During the etching process, a recess region 22 may be formed in the etch-target layer 20 between the mask patterns 30, as shown in FIG. 2. The etching process may be performed until an upper surface of the substrate 10 is exposed by the recess region 22, and as a result, the etch-target layer 20 may be divided into the patterns 26.

Referring to FIG. 3, during the etching process, the ion beam IB may have the first angle θ1 with respect to a bottom surface 22a of the recess region 22 and a second angle θ2 with respect to an inner side surface 22b of the recess region 22. In other words, on the bottom surface 22a of the recess region 22, the ion beam IB may be incident into the etch-target layer 20 at the that angle θ1. On the inner side surface 22b of the recess region 22, the ion beam IB may be incident into the etch-target layer 20 at the second angle θ2.

In the case where the inner side surface 22b of the recess region 22 is formed to have a third angle θ3 with respect to the reference line S, the second angle θ2 may be given by the following equation.

[Equation]

$$\theta 2 = 180° - \theta 1 - \theta 3 \quad [1]$$

In some embodiments, during the etching process, the recess region 22 may be formed to have a width that increases in a direction away from the top surface of the substrate 10. For example the third angle θ3 may be less than about 90°. But the inventive concepts may not be limited thereto.

The first angle θ1 may be greater than the second angle θ2. The first angle θ1 may range from about 50° to about 90°. In the case where the first angle θ1 is less than 50°, the ion beam IB may be blocked or shadowed from being incident into the surface of the etch-target layer 20 between the mask patterns 30 due to the height h of the mask patterns 30. Accordingly, portions of the etch-target layer 20 between the mask patterns 30 may not be etched.

The second angle θ2 may range from about 0° to about 40°. In the case where the second angle θ2 is greater than 40°, the mask patterns 30 of the height h may block the on beam IB from being incident into the surface of the etch-target layer 20 between the mask patterns 30, as described above. Accordingly, the etch-target layer 20 between the mask patterns 30 may not be etched.

During the etching process, an etch rate of the etch-target layer 20 may be dependent on an angle of the ion beam IB with respect to the surface of the etch-target layer 20 (i.e. an angle between the ion beam IB and the surface of the etch-target layer 20). For example, when the angle of the ion beam IB is the first angle θ1, the etch-target layer 20 may be etched at a first etch rate ER1 on the bottom surface 22a of the recess region 22. Also, when the angle of the ion beam IB is the second angle θ2, the etch-target layer 20 may be etched at second etch rate ER2 on the inner side surface 22b of the recess region 22.

The second etch rate ER2 may be equal to or higher than 60% of the first etch rate ER1 (i.e., ER2≥0.6*ER1). When the second etch rate ER2 is less than 60% of the first etch rate ER1, it may be difficult to etch the etch-target layer 20. For example, as shown in FIG. 4, during the etching process, an etch by-product may be produced from the bottom surface 22a of the recess region 22 and may be re-deposited on the inner side surface 22b of the recess region 22 to form an etch residue 24. In the case where the second etch rate ER2 is less than 60% of the first etch rate ER1, it may be difficult to remove the etch residue 24. In this case, as the etching process continues, an amount of the etch residue 24 may be increased to prevent the etch-target layer 20 from being etched through the recess region 22.

An incident energy of the ion beam IB may be controlled in such a way that the second etch rate ER2 is equal to or higher than 60% of the first etch rate ER1. The ion beam IB may have an incident energy ranging from about 600 eV to about 10 keV.

Figure 6A:
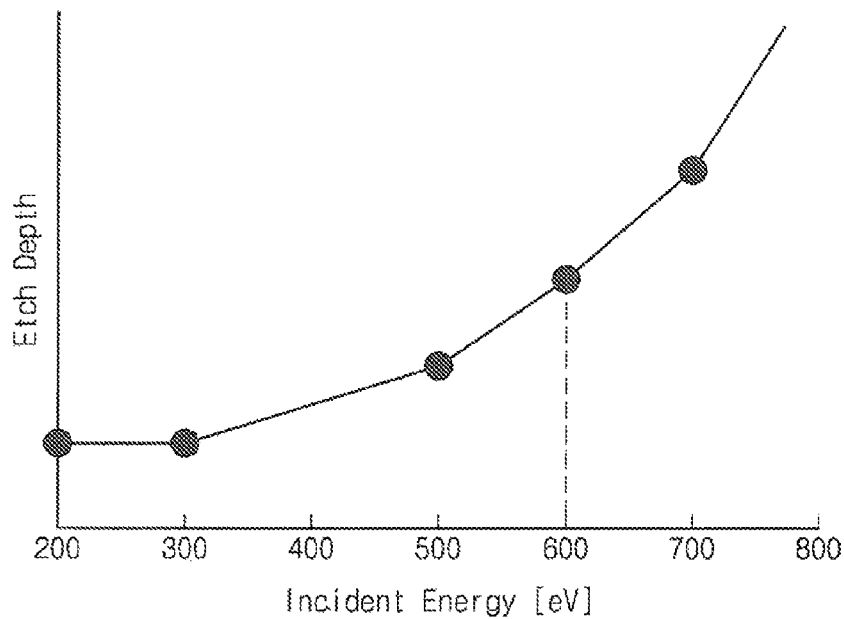
FIG. 6A is a graph showing a relationship between an etch depth of an etch-target layer and an incident energy of an ion beam.
Figure 6B:
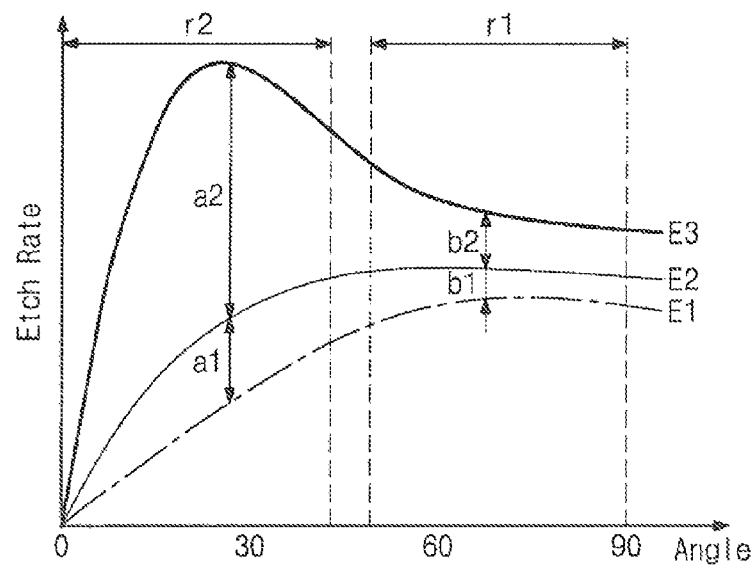
FIG. 6B is a graph showing dependence of an etch rate of an etch-target layer on an angle, with respect to a surface of the etch-target layer, and an incident energy of an is beam.

FIG. 6A is a graph showing a relationship between an etch depth of an etch-target layer and an incident energy of an ion beam, and FIG. 6B is a graph showing dependence of an etch rate of an etch-target layer on an angle, with respect to a surface of the etch-target layer, and an incident energy of an ion beam.

As shown in FIG. 6A, an increase in incident energy of the ion beam IB led to an increase in etch depth of the etch-target layer 20 (i.e., a depth of the recess region 22). In particular, in the case where the ion beam IB had an incident energy of 600 eV or higher, the etch-target layer 20 had a remarkably increased each depth. This means that when the ion beam IB has an incident energy higher than 600 eV, the etch-target layer can be easily etched through the recess region 22.

As shown in FIG. 6B, when the ion beam IB had different incident energies of E1, E2, and E3 (where E1≈200 eV, E2≈800 eV, E3≈10 keV; that is, E1<E2<E3), increments a1 and a2 in the etch rate of the etch-target layer 20 in a range r2 of incidence angles (i.e. about 0° to about 40°) of the second angle θ2 was larger than increments b1 and b2 in the etch rate of the etch-target layer 20 in a range r1 of incidence angles (i.e. about 50° to about 90°) of the first angle θ1. In other words, when the incident energy of the ion beam IB was increased (i.e., E1<E2<E3), the second etch rate ER2 on the inner side surface 22b of the recess region 22 (where the incidence angle is low) was more rapidly increased than the first etch rate ER1 on the bottom surface 22a of the recess region 22 (where the incidence angle is high). This means that an increase in the incident energy of the ion beam IB (i.e., E1<E2<E3) makes it easy to remove the etch residue 24 that may be re-deposited on the inner side surface 22b of the recess region 22.

In other words, as shown in FIGS. 6A and 6B, if the ion beam IB has an incident energy higher than 600 eV, it may be possible to more easily remove the etch residue 24 that is re-deposited on the inner side surface 22b of the recess region 22, and consequently, to more easily etch the etch-target layer 20 through the recess region 22. In some cases, the incident energy of the ion beam may be greater than 1 keV, in some cases higher than 2 keV, and in some cases higher than 5 keV.

Due to the rapid increase in etch depth for incident energies greater than 600 eV illustrated in FIG. 6A, it may normally be considered undesirable to increase the incident energy to greater than 600 eV out of a concern for over-etching the etch-target. Thus, incident energies for ion etching are typically kept at 500 eV or lower. However, as shown in FIG. 6B, the etch rate for high etch angles (e.g., about 50° to about 90°) does not increase as quickly as the etch rate for low etch angles (e.g., about 0° to about 40°) as the incident energy increases. Thus, according to some embodiments, the incident energy and the respective etch angles of the bottom and side surfaces of the recess region 22 may be selected to more effectively remove etch residue from the recess region without overetching the etch-target.

In the case where the incident energy of the ion beam IB is less than 600 eV, it may be more difficult to remove the etch residue 24 from the recess region 22, and thus, it may be difficult to etch the etch-target layer 20 through the recess region 22. In the case where the incident energy of the ion beam IB is higher than 10 keV, it may be difficult to form the patterns 26 using a sputtering process.

Referring back to FIG. 5, after the etching process, when viewed in a sectional view, a width 30W of the mask patterns 30 may be increased in the direction away from the top surface of the substrate 10. That is, the mask patterns 30 may become more narrow toward the substrate 10. Each of the patterns 26 may have a side surface 26$i$ that is substantially perpendicular to the top surface of the substrate 10. Thus, a width 26W of the patterns 26 may be substantially constant over the height of the patterns 26. In other example embodiments, each of the patterns 26 may have a side surface 26$j$ that is at an angle to the top surface of the substrate 10. In this case, the width 26W of the patterns 26 may be increased in the direction away from the top surface of the substrate 10. The maximum width of the mask patterns 30 may be greater than that of the patterns 26.

According to some embodiments of the inventive concepts, during the etching process, the ion beam IB may be incident into the etch-target layer 20 at the first angle $\theta1$ with respect to the bottom surface 22$a$ of the recess region 22 and at the second angle $\theta2$ with respect to the inner side surface 22$b$ of the recess region 22. The first angle $\theta1$ may be greater than the second angle $\theta2$. Further, the incident energy of the ion beam IB may be greater than 600 eV (in some cases greater than 1 keV, in some cases greater than 2 keV, and in some cases greater than 5 keV, and thus, the second etch rate ER2 on the inner side surface 22$b$ of the recess region 22 can be controlled to be equal to or higher than 60% of the first etch rate ER1 on the bottom surface 22$a$ of the recess region 22. As a result, it is possible to more easily remove the etch residue 24 that is re-deposited on the inner side surface 22$b$ of the recess region 22, and thereby to more easily etch the etch-target layer 20 through the recess region 22.

FIGS. 7 through 10 are sectional views illustrating methods of fabricating semiconductor devices using patterning methods according to further embodiments of the inventive concepts. FIG. 11A is a sectional view illustrating a magnetic tunnel junction pattern according to some embodiments of the inventive concepts, and FIG. 11B is a sectional view illustrating a magnetic tunnel junction pattern according to other embodiments of the inventive concepts.

Figure 7:
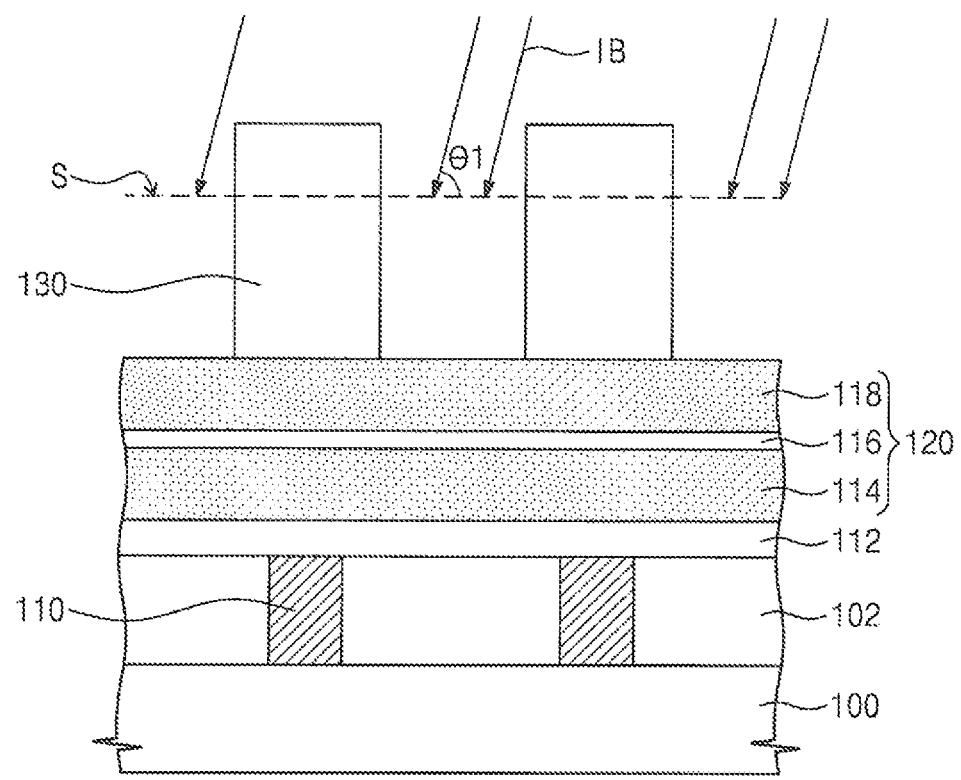
FIGS. 7 through 10 are sectional views illustrating a method of fabricating a semiconductor device using a patterning method according to some embodiments of the inventive concept.

Referring to FIG. 7, a lower interlayer insulating layer 102 may be formed on a substrate 100. The substrate 100 may include a semiconductor wafer. For example, the substrate 100 may include a silicon wafer, a germanium wafer, or a silicon-germanium wafer. In example embodiments, selection elements (not shown) may be formed on the substrate 100, and the lower interlayer insulating layer 102 may be formed to cover the selection elements. The selection elements may be, for example, field effect transistors. Alternatively, the selection elements may be diodes. The lower interlayer insulating layer 102 may be formed to have a single- or multi-layered structure including at least one of an oxide layer, a nitride layer, and/or an oxynitride layer.

Contact plugs 110 may be formed in the lower interlayer insulating layer 102. Each of the contact plugs 110 may be electrically connected to a terminal of a corresponding one of the selection elements through the lower interlayer insulating layer 102. The contact plugs 110 may include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A lower electrode layer 112 and a magnetic tunnel junction layer 120 may be sequentially stacked on the lower interlayer insulating layer 102. The lower electrode layer 112 may include a conductive metal nitride (e.g., titanium nitride and/or tantalum nitride).

The lower electrode layer 112 may include a material (e.g., ruthenium) capable of contributing to growth of magnetic layers provided in the magnetic tunnel junction layer 120. The lower electrode layer 112 may be formed using, for example, a sputtering, chemical vapor deposition, or atomic layer deposition process.

The magnetic tunnel junction layer 120 may include a first magnetic layer 114, a tunnel barrier layer 116, and a second magnetic layer 118, which are sequentially stacked on the lower electrode layer 112. One of the first and second magnetic layers 114 and 118 may serve as a reference layer with a fixed magnetization direction, and the other may serve as a free layer, whose magnetization direction can be switched to be parallel or anti-parallel to that of the reference layer.

In example embodiments, the magnetization directions of the reference and free layers may be substantially perpendicular to an interface between the tunnel barrier layer 116 and the second magnetic layer 118. For example, the reference and free layers may include at least one of perpendicular magnetic materials (e.g., CoFeTb, CoFeGd, and CoFeDy), perpendicular magnetic materials with $L1_0$ structure, CoPt-based materials with hexagonal-close-packed structure, and perpendicular magnetic structures. Here, the perpendicular magnetic materials with $L1_0$ structure may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers. Here, the reference layer may be thicker than the free layer, and the reference layer may have a coercive force that is stronger than that of the free layer.

In other embodiments, the magnetization directions of the reference and free layers may be substantially parallel to the interface between the tunnel barrier 116 and the second magnetic layer 118. For example, each of the reference and free layers may include a ferromagnetic material. The reference layer may further include an anti-ferromagnetic material, allowing the ferromagnetic material in the reference layer to have a fixed magnetization direction.

The tunnel barrier layer 116 may include at least one of magnesium oxide, titanium oxide, aluminum oxide, magnesium-zinc oxide, or magnesium-boron oxide.

Each of the first magnetic layer 114, the tunnel barrier layer 116, and the second magnetic layer 118 may be formed by, for example, a physical vapor deposition or chemical vapor deposition process.

Conductive mask patterns 130 may be formed on the magnetic tunnel junction layer 120. The conductive mask patterns 130 may include at least one of tungsten, titanium, tantalum, aluminum, and metal nitrides (e.g., titanium nitride and tantalum nitride). The conductive mask patterns 130 may define magnetic tunnel junction patterns, which will be described below.

An etching process using the conductive mask patterns 130 as an etch mask may be performed on the magnetic tunnel junction layer 120. The etching process may be performed using a sputtering technique. In detail, during the etching process, an ion beam IB may be incident into the resulting structure provided with the conductive mask patterns 130. The ion beam IB may include, for example, positive ions of argon (Ar). The ion beam IB may be incident into a surface of the magnetic tunnel junction layer 120 at an angle (hereinafter, first angle) of θ1 with respect to a reference line S that is parallel to the top surface of the substrate 100. During the etching process, the substrate 100 may be rotated about a rotating axis normal to the top surface of the substrate 100, and this makes it possible to symmetrically etch the magnetic tunnel junction layer 120 between the conductive mask patterns 130.

Figure 8:
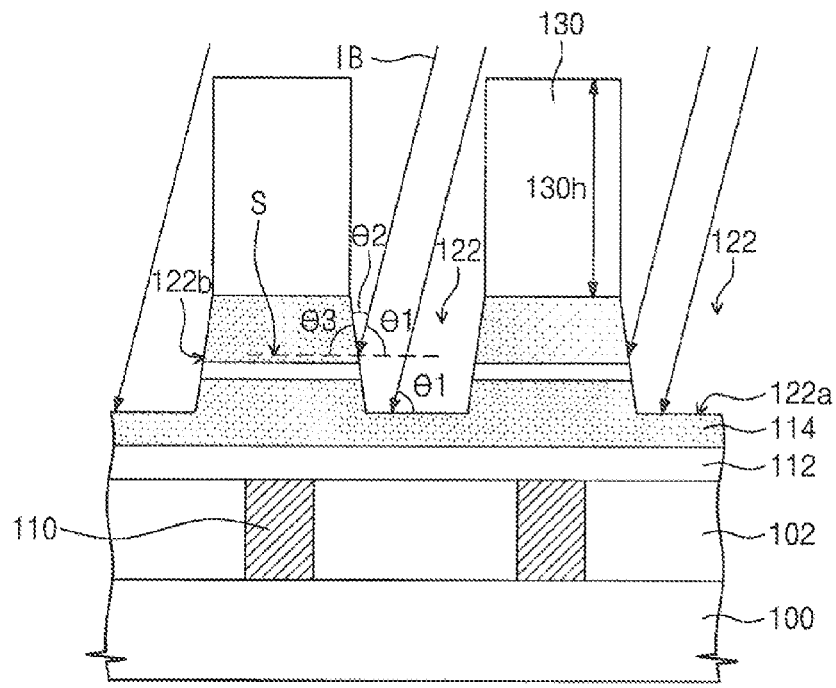
Figure 9:
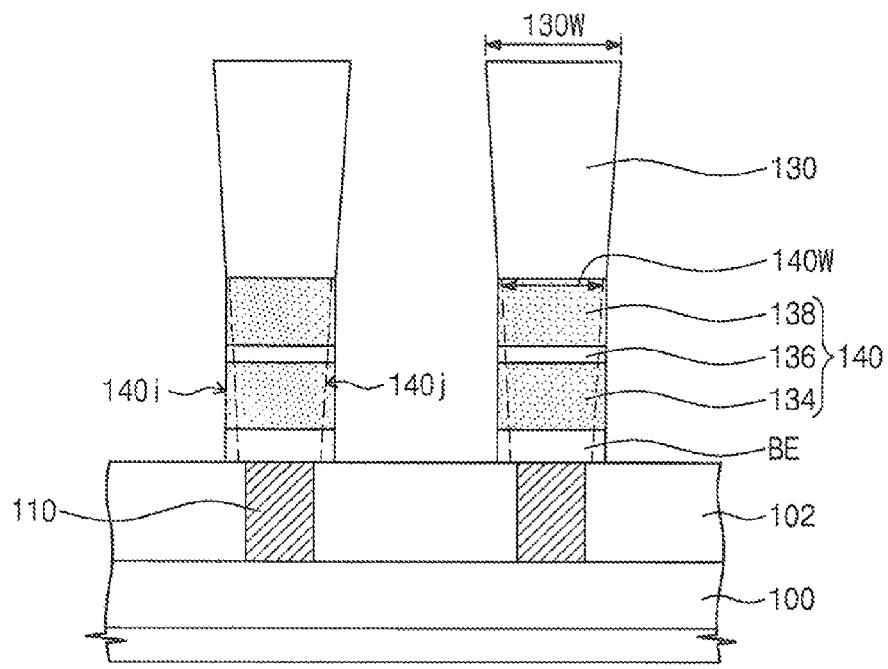

Referring to FIGS. 8 and 9, as a result of the etching process, the magnetic tunnel junction layer 120 may be etched to form magnetic tunnel junction patterns 140 spaced apart from each other on the substrate 100. Further, the etching process may be performed to etch the lower electrode layer 112, and thus, lower electrodes BE spaced apart from each other may be formed on the substrate 100. The magnetic tunnel junction patterns 140 may be formed on the lower electrodes BE, respectively. Each of the magnetic tunnel junction patterns 140 may include a first magnetic pattern 134, a tunnel barrier pattern 136, and a second magnetic pattern 138, which are sequentially stacked on a corresponding one of the lower electrodes BE.

During the etching process, a recess region 122 may be formed in the magnetic tunnel junction layer 120 between the conductive mask patterns 130, as shown in FIG. 8. The etching process may be performed until a top surface of the lower interlayer insulating layer 102 is exposed by the recess region 122. Accordingly, the magnetic tunnel junction layer 120 may be divided into the magnetic tunnel junction patterns 140, and the lower electrode layer 112 may be divided into the lower electrodes BE.

During the etching process, the ion beam IB may have a first angle θ1 with respect to a bottom surface 122a of the recess region 122 and a second angle θ2 with respect to an inner side surface 122b of the recess region 122, as described with reference to FIG. 3. In other words, on the bottom surface 122a of the recess region 122, the ion beam IB may be incident into the magnetic tunnel junction layer 120 at the first angle θ1. On the inner side surface 122b of the recess region 122, the ion beam IB may be incident into the magnetic tunnel junction layer 120 at the second angle θ2.

In the case where, as described with reference to FIG. 3, the inner side surface 122b of the recess region 122 is formed to have the third angle θ3 with respect to the reference line S, the second angle θ2 may be given by equation [1] above.

The first angle θ1 may be greater than the second angle θ2. The first angle θ1 may range from about 50° to about 90°. In the case where the first angle θ1 is less than 50°, due to a height 130h of the conductive mask patterns 130, the ion beam IB may be blocked from being incident onto the surface of the magnetic tunnel junction layer 120 between the conductive mask patterns 130. Accordingly, the magnetic tunnel junction layer 120 between the conductive mask patterns 130 may not be etched.

The second angle θ2 may range from about 0° to about 40°. In the case where the second angle θ2 is greater than 40°, the conductive mask patterns 130 of the height 130h may prevent the ion beam IB from being incident into the surface of the magnetic tunnel junction layer 120 between the conductive mask patterns 130, as described above. Accordingly, the magnetic tunnel junction layer 120 between the conductive mask patterns 130 may not be etched.

During the etching process, an etch rate of the magnetic tunnel junction layer 120 may be dependent on an angle of the ion beam IB with respect to the surface of the magnetic tunnel junction layer 120 (i.e an angle between the ion beam IB and the surface of the magnetic tunnel junction layer 120). For example, when the angle of the ion beam IB is the first angle θ1, the magnetic tunnel junction layer 120 may be etched at the first etch rate ER1 on the bottom surface 122a of the recess region 122. Also, when the angle of the ion beam IB is the second angle θ2, the magnetic tunnel junction layer 120 may be etched at the second etch rate ER2 on the inner side surface 122b of the recess region 122.

The second etch rate ER2 may be equal to or higher than 60% of the first etch rate ER1 (i.e., ER2≥0.6*ER1). In the case where the second etch rate ER2 is less than 60% of the first etch rate ER1, it may be difficult to etch the magnetic tunnel junction layer 120. For example, as described with reference to FIG. 4, during the etching process, a conductive etch by-product may be produced from the bottom surface 122a of the recess region 122 and may be re-deposited on the inner side surface 122b of the recess region 122 to form an etch residue 24. In the case where the second etch rate ER2 is less than 60% of the first etch rate ER1, it may be difficult to remove the etch residue 24. In this case, as the etching process continues, an amount of the etch residue 24 may be increased, which may block the magnetic tunnel junction layer 120 from being etched through the recess region 122. If the etching process is continued to form the magnetic tunnel junction patterns 140, the etch residue 24 may remain on side surfaces of the magnetic tunnel junction patterns 140, and in this case, at least one of the magnetic tunnel junction patterns 140 may suffer from an electric short between the first magnetic pattern 134 and the second magnetic pattern 138.

According to some embodiments of the inventive concepts, the incident energy of the ion beam IB may be controlled in such a way that the second etch rate ER2 is equal to or higher than 60% of the first etch rate ER1. The ion beam IB may have an incident energy ranging from about 600 eV to about 10 keV. In some cases, the ion beam IB may have an incident energy ranging from 1 keV to 10 keV, in some cases from 2 keV to 10 keV, and in some cases from 5 keV to 10 keV. As described with reference to FIGS. 6A and 6B, if the ion beam IB has an incident energy higher than 600 eV, it may be possible to more easily remove the etch residue 24 that is re-deposited on the inner site surface 122b of the recess region 122, and thus, the magnetic tunnel junction layer 120 can be easily etched through the recess region 122. In addition, it may be possible to reduce an amount of the etch residue 24 remaining on side surfaces of the magnetic tunnel junction patterns 140, and this makes it possible to prevent an electric short between the first and second magnetic patterns 134 and 138 from occurring in each of the magnetic tunnel junction patterns 140.

In the case where the incident energy of the ion beam IB is less than 600 eV, it may be difficult to remove the etch residue 24 from the recess region 122, as described above, and thus, it may be difficult to etch the magnetic tunnel junction layer 120 through the recess region 122. In the case where the incident energy of the ion beam IB is higher than 10 keV, it may be difficult to form the magnetic tunnel junction patterns 140 using a sputtering process.

Referring back to FIG. 9, after the etching process, when viewed in a sectional view, a width 130W of the conductive mask patterns 130 may be increased in the direction away from the top surface of the substrate 100. Each of the magnetic tunnel junction patterns 140 may have a side surface 140*i* that is substantially perpendicular to the top surface of the substrate 100. In other words, a width 140W of the magnetic tunnel junction patterns 140 may be substantially constant over the height of the magnetic tunnel junction patterns 140, i.e., regardless of a distance from the top surface of the substrate 100. In other example embodiments, each of the magnetic tunnel junction patterns 140 may have a side surface 140*j* that is at an angle to the top surface of the substrate 100. In this case, the width 140W of the magnetic tunnel junction patterns 140 may be increased in the direction away from the top surface of the substrate 100. A maximum width of the conductive mask patterns 130 may be larger than that of the magnetic tunnel junction patterns 140.

The lower electrodes BE may be electrically and respectively connected to the contact plugs 110, which are provided in the lower interlayered insulating layer 102. In example embodiments, each of the lower electrodes BE may have a bottom surface in contact with a top surface of a corresponding one of the contact plugs 110.

In example embodiments, as shown in FIG. 11A, the first and second magnetic patterns 134 and 138 may have magnetization directions 134*a* and 138*a* that are substantially parallel to an interface between the tunnel barrier pattern 136 and the second magnetic pattern 138 (e.g., to the top surface of the lower electrode BE). FIG. 11A shows an example in which the first and second magnetic patterns 134 and 138 are used as the reference and free patterns, respectively, but example embodiments of the inventive concepts may not be limited thereto. For example, unlike that shown in FIG. 11A, the first and second magnetic patterns 134 and 138 may be used as the free and reference patterns, respectively. The reference pattern may be thicker than the free pattern or have a coercive force stronger than that of the free pattern.

Each of the first and second magnetic patterns 134 and 138 may include at least one of ferromagnetic materials. The first magnetic pattern 134 may further include an antiferromagnetic material, allowing the ferromagnetic material therein to have a fixed magnetization direction.

In other example embodiments, as shown in FIG. 11B, the magnetization directions 134*a* and 138*a* of the first and second magnetic patterns 134 and 138 may be substantially perpendicular to the interface between the tunnel barrier pattern 136 and the second magnetic pattern 138 (e.g., to the top surface of the lower electrode BE). FIG. 11B shows an example in which the first and second magnetic patterns 134 and 138 are used as the reference and free patterns, respectively, but in certain embodiments, unlike that shown in FIG. 11B, the first and second magnetic patterns 134 and 138 may be used as the free and reference patterns, respectively.

The first and second magnetic patterns 134 and 138 having the magnetization directions 134*a* and 138*a* may include at least one of perpendicular magnetic materials (e.g., CoFeTb, CoFeGd, and CoFeDy), perpendicular magnetic materials with L10 structure, CoPt-based materials with hexagonal-close-packed structure, and perpendicular magnetic structures. Here, the perpendicular magnetic materials with $L1_0$ structure may include at least one of $L1_0$ FePt, $L1_0$ FePd, $L1_0$ CoPd, or $L1_0$ CoPt. The perpendicular magnetic structures may include magnetic layers and nonmagnetic layers that are alternately and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

Figure 10:
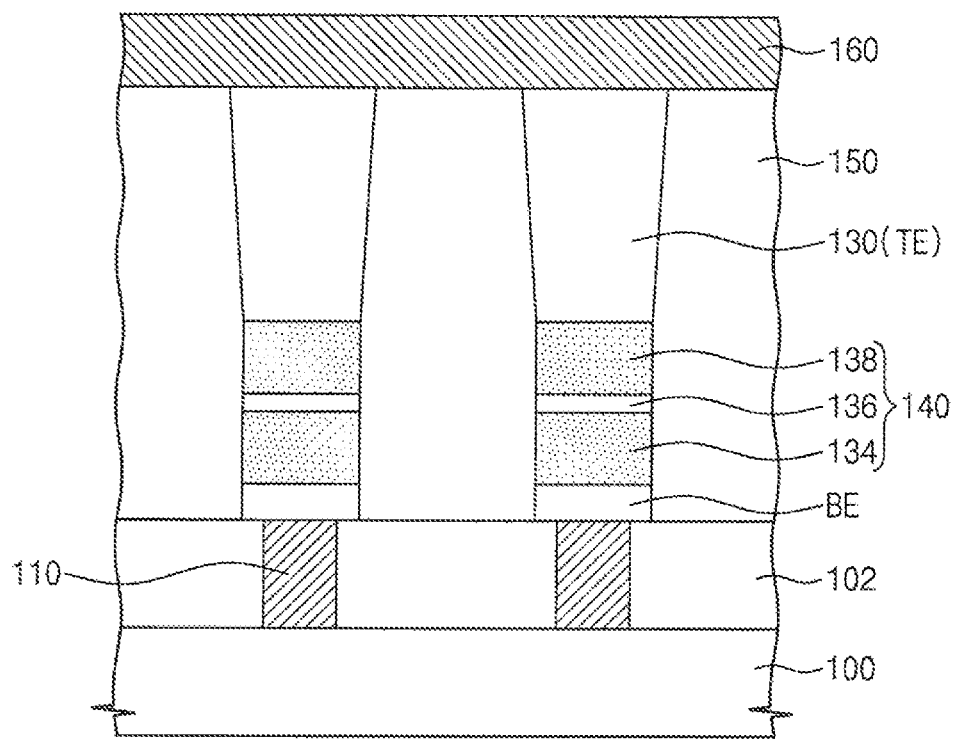
Figure 11A:
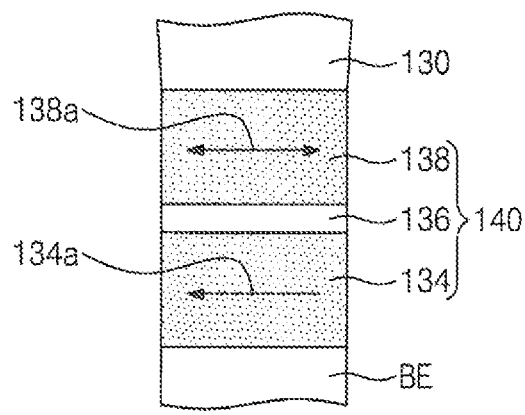
FIG. 11A is a sectional view illustrating a magnetic tunnel junction pattern according to some embodiments of the inventive concept.
Figure 11B:
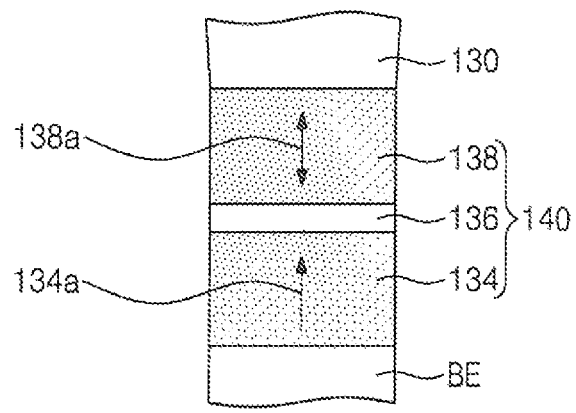
FIG. 11B is a sectional view illustrating a magnetic tunnel junction pattern according to other some embodiments of the inventive concept.

Referring to FIG. 10, an upper interlayered insulating layer 150 may be provided on the lower interlayered insulating layer 102 to cover the lower electrodes BE, the magnetic tunnel junction patterns 140, and the conductive mask patterns 130. The conductive mask patterns 130 may be provided on the magnetic tunnel junction patterns 140, respectively, to serve as upper electrodes TE. The upper interlayered insulating layer 150 may be formed to have a single- or multi-layered structure. As an example, the upper interlayered insulating layer 150 may include at least one of an oxide layer (e.g., silicon oxide), a nitride layer (e.g., silicon nitride), and/or an oxynitride layer (e.g., silicon oxynitride). The interconnection line 160 may be formed on the upper interlayered insulating layer 150. The interconnection line 160 may extend in a direction and may be electrically connected to a plurality of the magnetic tunnel junction patterns 140 arranged thereunder. Each of the magnetic tunnel junction patterns 140 may be connected to the interconnection line 160 through a corresponding one of the upper electrodes TE. In example embodiments, the interconnection line 160 may serve as a bit line.

According to example embodiments of the inventive concept, during the etching process for forming the magnetic tunnel junction patterns 140, an angle of the ion beam IB may be the first angle $\theta 1$ with respect to the bottom surface 122*a* of the recess region 122 and the second angle $\theta 2$ with respect to the inner side surface 122*b* of the recess region 122. The first angle $\theta 1$ may be greater than the second angle $\theta 2$. Further, the incident energy of the ion beam IB may be greater than 600 eV, and in this case, the second each rate ER2 on the inner side surface 122*b* of the recess region 122 can be controlled to be equal to or higher than 60% of the first etch rate ER1 on the bottom surface 122*a* of the recess region 122. Accordingly, it is possible to easily remove the etch residue 24, which is re-deposited on the inner side surface 122*b* of the recess region 122, and thus, the magnetic tunnel junction layer 120 can be easily etched through the recess region 122. Further, it is possible to reduce an amount of the etch residue 24 remaining on side surfaces of the magnetic tunnel junction patterns 140, and this makes it possible to prevent an electric short between the first and second magnetic patterns 134 and 138 from occurring in each of the magnetic tunnel junction patterns 140. As a result, it is possible to fabricate a semiconductor device with improved reliability.

Figure 12:
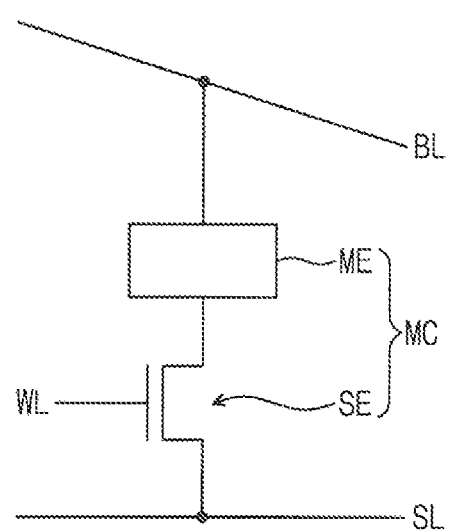
FIG. 12 is a circuit diagram illustrating a unit memory cell of a semiconductor device, which is fabricated using a patterning method according to some embodiments of the inventive concept.

FIG. 12 is a circuit diagram illustrating a unit memory cell of a semiconductor device, which is fabricated using a patterning method according to example embodiments of the inventive concept.

Referring to FIG. 12, a unit memory cell MC may be provided between and connected to a word line WL and a bit line BL crossing each other. The unit memory cell MC may include a magnetic memory element ME and a selection element SE. The selection element SE and the magnetic memory element ME may be electrically connected in series to each other. The magnetic memory element ME may be connected between the bit line BL and the selection element SE, and the selection element SE may be connected between the magnetic memory element ME and the word line WL.

The magnetic memory element ME may include a magnetic tunnel junction (MTJ). The selection element SE may be configured to selectively control a current flow of an electric current passing through the magnetic tunnel junction. For example, the selection element SE may be one of a diode, a PNP bipolar transistor, an NPN bipolar transistor, an NMOS field effect transistor (FET), and a PMOS FET.

In example embodiments, the selection element SE is a three-terminal device (e.g., a bipolar transistor or a metal-oxide-semiconductor field effect transistor), the semiconductor device may further include a source line SL connected to, for example, a source electrode of such a transistor. The source line SL may be provided between the word lines WL adjacent to each other, and one source line SL may be shared by at least two transistors.

Figure 13:
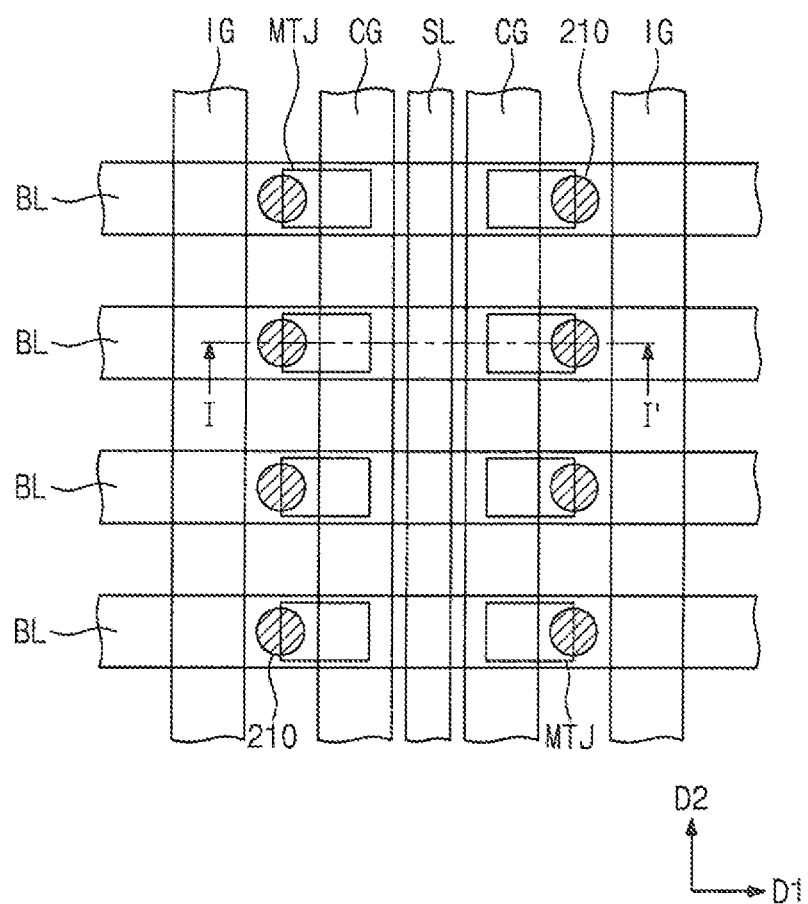
FIG. 13 is a plan view illustrating a semiconductor device, which is fabricated using a patterning method according to some embodiments of the inventive concept.
Figure 14:
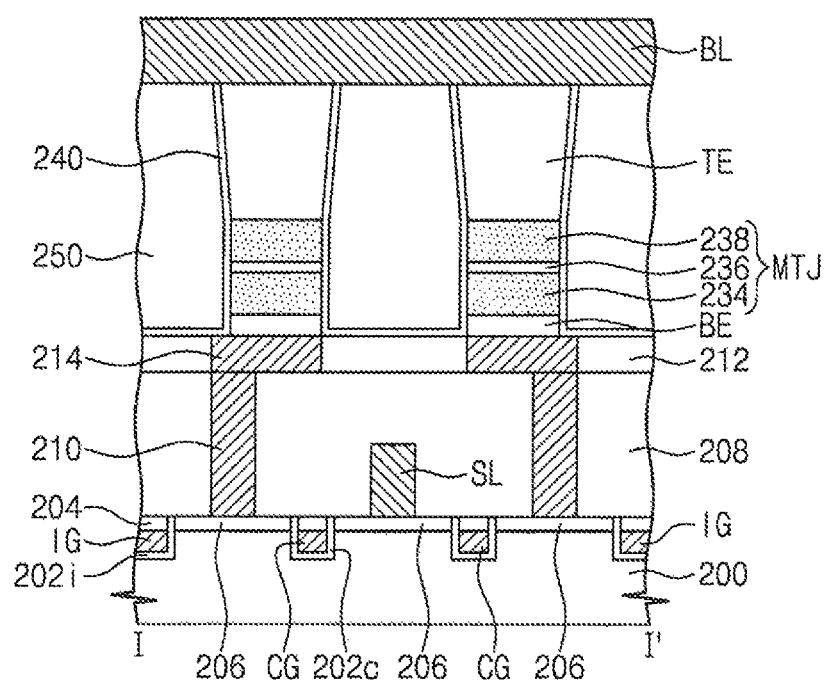
FIG. 14 is a sectional view taken along line I-I' of FIG. 13.

FIG. 13 is a plan view illustrating a semiconductor device, which is fabricated using a patterning method according to example embodiments of the inventive concept, and FIG. 14 is a sectional view taken along line I-I' of FIG. 13.

Referring to FIGS. 13 and 14, selection elements may be provided on a substrate 200. The selection elements may be, for example, transistors. The transistors may include cell gate electrodes CG on the substrate 200. When viewed in plan view, the cell gate electrodes CG may be spaced apart from each other in a first direction D1 and may extend in a second direction D2 crossing the first direction D1. Cell gate dielectric layers 202c may be respectively disposed between the cell gate electrodes CG and the substrate 200. The transistors including the cell gate electrodes CG may include recessed channel regions.

Isolation gate electrodes IG may be disposed spaced apart from each other with a pair of cell gate electrodes CG interposed therebetween. When viewed in plan view, the isolation gate electrodes IG may also be spaced apart from each other in the first direction D1 and may extend in the second direction D2. Isolation gate dielectric layers 202i may be respectively provided between the isolation gate electrodes IG and the substrate 200.

Gate hard mask patterns 204 may be disposed on the cell and isolation gate electrodes CG and IG, respectively. Each of the gate hard mask patterns 204 may have a top surface substantially coplanar with that of the substrate 200.

When the semiconductor memory device is operated, an isolation voltage may be applied to at least one of the isolation gate electrodes IG. This makes it possible to prevent an unintended channel region from being formed below the isolation gate electrodes IG. In other words, the isolation voltage may allow an isolation channel region positioned below each of the isolation gate electrodes IG to be in a turn-off state, and thus, an active region may be defined between the isolation gate electrodes IG.

The cell gate electrodes CG may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). The isolation gate electrodes IG may include the same material as the cell gate electrodes CG. The cell gate dielectric layers 202c and the isolation gate dielectric layers 202i may include at least one of an oxide layer (e.g., silicon oxide), a nitride layer (e.g., silicon nitride), an oxynitride layer (e.g., silicon oxynitride), and/or a high-k dielectric layer, such as insulating metal oxides (e.g., hafnium oxide or aluminum oxide). The gate hard mask patterns 204 may include at least one of an oxide layer (e.g., silicon oxide), a nitride layer (e.g., silicon nitride), and/or an oxynitride layer (e.g., silicon oxynitride).

Source/drain regions 206 may be provided at both sides of each of the cell gate electrodes CG. The pair of cell gate electrodes CG may share one of the source/drain regions 206 disposed therebetween. The source/drain regions 206 may be doped to have a different conductivity type from that of the substrate 200.

A source line SL may be provided on a portion of the substrate 200 positioned between each pair of cell gate electrodes CG. The source line SL may be electrically coupled to the source/drain region 206 between the pair of cell gate electrodes CG. A pair of selection elements disposed adjacent to each other may share the source line SL interposed therebetween. The source line SL may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal suicide).

A first interlayered insulating layer 208 may be provided on the substrate 200 to cover the cell and isolation gate electrodes CG and IG and the source line SL. The first interlayered insulating layer 208 may be formed of or include, for example, a silicon oxide layer. Contacts 210 may be provided through the first interlayered insulating layer 208 and may be coupled to the source/drain regions 206, respectively. When viewed in plan view, the contacts 210 may be two-dimensionally disposed on the substrate 200. The contacts 210 may be coupled to the source/drain regions 206, to which the source line SL is not connected. In other words, some of the source/drain regions 206 may be coupled to the source line SL, and the others may be coupled to the contacts 210. A top surface of each of the contacts 210 may be substantially coplanar with that of the first interlayered insulating layer 208. The contacts 210 may be formed of or include at least one of, for example, metals, conductive metal nitrides, or doped semiconductor materials.

A buried insulating layer 212 may be provided on the first interlayered insulating layer 208. The buried insulating layer 212 may be formed of or include, for example, silicon nitride. Conductive pads 214 may be provided through the buried insulating layer 212 and may be connected to the contacts 210, respectively. Each of the conductive pads 214 may have a top surface substantially coplanar with that of the buried insulating layer 212. The conductive pads 214 may be formed of or include at least one of, for example, metals, conductive metal nitrides, or doped semiconductor materials. The contacts 210 and the conductive pads 214 may be used to connect the source/drain regions 206 to magnetic tunnel junctions, which will be formed in a subsequent process.

Bottom electrodes BE may be provided on the buried insulating layer 212 and may be coupled to the conductive pads 214, respectively. Magnetic tunnel junctions MTJ may be provided on and connected to the bottom electrodes BE respectively. Upper electrodes TE may be provided on and connected to the magnetic tunnel junction patterns MTJ, respectively. The bottom electrodes BE and the top electrodes TE may be formed of or include at least one of, for example, metals, conductive metal nitrides, or doped semiconductor materials.

The magnetic tunnel junction patterns MTJ may be electrically connected to the source/drain regions 206, respectively, through the lower electrodes BE, the conductive pads 214, and the contacts 210. As shown in FIG. 13, the magnetic tunnel junction patterns MTJ may be arranged spaced apart from each other in the first direction D1 and the second direction D2, when viewed in a plan view.

Each of the magnetic tunnel junction patterns MTJ may include a first magnetic pattern 234, a tunnel barrier pattern 236, and a second magnetic pattern 238, which are sequentially stacked on each of the lower electrodes BE. The first magnetic pattern 234, the tunnel barrier pattern 236, and the second magnetic pattern 238 may be formed to have the same materials and features as those of the previous embodiments described with reference to FIGS. 9, 11A, and 11B.

As described with reference to FIG. 9, the upper electrodes TE may be formed to have a width increasing in a direction away from the top surface of the substrate 200, when viewed in a sectional view. The side surfaces of the magnetic tunnel junction patterns MTJ may be substantially perpendicular to the top surface of the substrate 200. In other words, the magnetic tunnel junction patterns MTJ may have a uniform width, regardless of a distance from the top surface of the substrate 200. Alternatively, the side surfaces of the magnetic tunnel junction patterns MTJ may be at an angle to the top surface of the substrate 200. For example, the width of the magnetic tunnel junction patterns MTJ may increase in the direction away from the top surface of the substrate 200. A maximum width of the upper electrodes TE may be larger than that of the magnetic tunnel junction patterns MTJ.

A second interlayered insulating layer 250 may be provided on the buried insulating layer 212 to cover the lower electrodes BE, the magnetic tunnel junction patterns MTJ, and the upper electrodes TE. The second interlayered insulating layer 250 may be, for example, a silicon oxide layer. Each of the upper electrodes TE may have a top surface substantially coplanar with that of the second interlayered insulating layer 250. A capping layer 240 may be provided between the second interlayered insulating layer 250 and side surfaces of each of the upper electrodes TE, the magnetic tunnel junction patterns MTJ, and the lower electrodes BE. The capping layer 240 may extend between the buried insulating layer 212 and the second interlayered insulating layer 250 and may cover the top surface of the buried insulating layer 212. The capping layer 240 may be formed of or include, for example, a metal oxide layer e.g., aluminum oxide).

Bit lines BL may be provided on the second interlayered insulating layer 250. The bit lines BL may be spaced apart from each other in the second direction D2 and may extend parallel to the first direction D1. Each of the bit lines BL may be electrically connected in common to a plurality of the magnetic tunnel junction patterns MTJ arranged spaced apart from each other in the first direction D1. The bit lines BL may be formed of or include, for example, at least one of metals or conductive metal nitrides.

Figure 15:
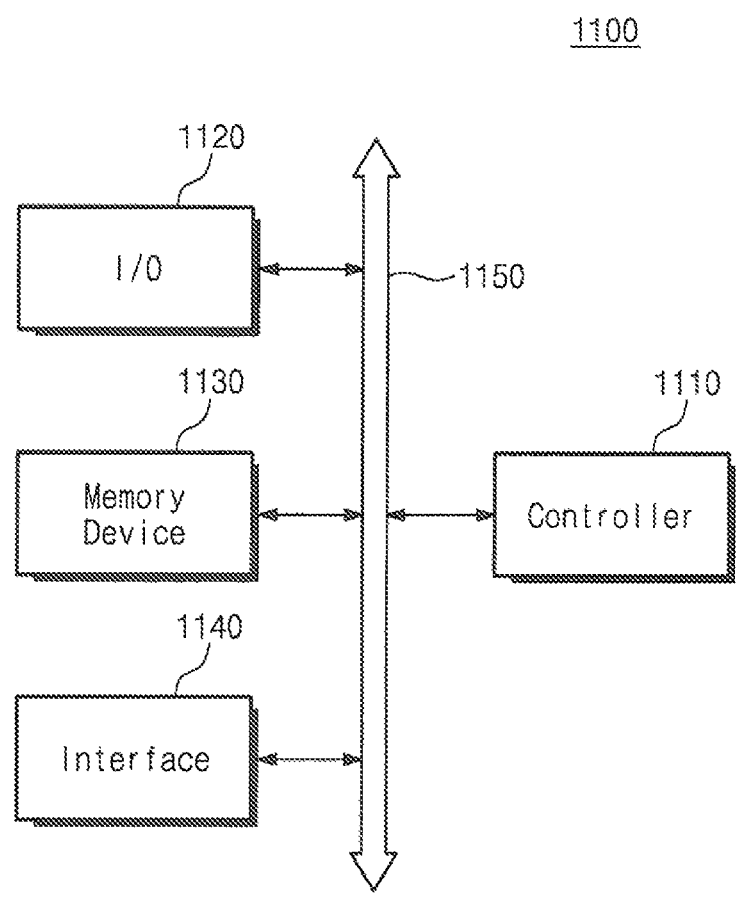
FIG. 15 is a schematic block diagram illustrating an some of electronic systems including a semiconductor device according to some embodiments of the inventive concept.

FIG. 15 is a schematic block diagram illustrating an example of electronic systems including a semiconductor device according to example embodiments of the inventive concept.

Referring to FIG. 15, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O unit 1120 may include a keypad, a keyboard, or a display unit. The memory device 1130 may store data and/or commands. The memory device 1130 may include at least one of the semiconductor memory devices according to the afore-described embodiments. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 16:
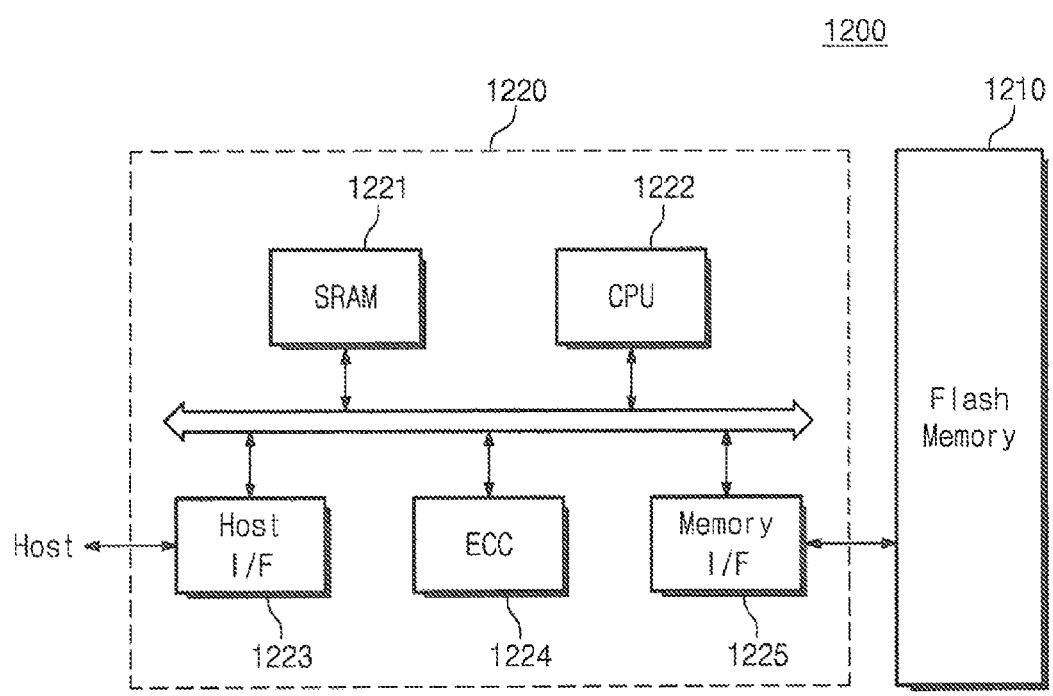
FIG. 16 is a schematic block diagram illustrating an some of memory cards including a semiconductor device according to some embodiments of the inventive concept.

FIG. 16 is a schematic block diagram illustrating an example of memory cards including a semiconductor device according to example embodiments of the inventive concept.

Referring to FIG. 16, a memory card 1200 according to example embodiments of the inventive concept may include a memory device 1210. At least one of the afore-described semiconductor devices may be configured to realize a semiconductor memory device, which may be used as the memory device 1210. The memory card 1200 may include a memory controller 1220 that control data exchanging operations between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as a solid state drive (SSD) of the computer systems.

According to example embodiments of the inventive concept, an etching process using an ion beam may be performed to form magnetic tunnel junction patterns. During the etching process, a recess region may be formed in a magnetic tunnel junction layer, and in this case, an angle of the ion beam may be a first angle with respect to a bottom surface of the recess region and a second angle with respect to an inner side surface of the recess region. The first angle may be greater than the second angle. Further, an incident energy of the ion beam may be greater than 600 eV, and in this case, a second etch rate on the inner side surface of the recess region can be controlled to be equal to or higher than 60% of a first etch rate on the bottom surface of the recess region. Accordingly, in the patterning method according to example embodiments of the inventive concept, it is possible to easily remove an etch residue, which is re-deposited on the inner side surface of the recess region.

In the case where the patterning method is used to form the magnetic tunnel junction patterns from the magnetic tunnel junction layer, it is possible to easily remove an etch residue, which may be re-deposited on the inner side surface of the recess region during the etching process. In other words, it is possible to reduce an amount of the etch residue remaining on the side surfaces of the magnetic tunnel junction patterns, and this makes it possible to prevent an electric short from being formed between first and second magnetic patterns of each of the magnetic tunnel junction patterns. As a result, it is possible to fabricate a semiconductor device with improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming patterns, comprising:
forming an etch-target layer on a substrate;
forming mask patterns on the etch-target layer; and
etching the etch-target layer using the mask patterns as an etch mask to form patterns that are spaced apart from each other,
wherein etching the etch-target layer comprises irradiating the etch-target layer with an ion beam, the ion beam having an incident energy in a range from 600 eV to 10 keV;
wherein etching the etch-target layer comprises forming a recess region in the etch-target layer between the mask patterns; and
wherein the ion beam is incident onto a bottom surface of the recess region at a first angle with respect to a top surface of the substrate and is incident onto an inner side surface of the recess region at a second angle with respect to the inner side surface of the recess region, wherein the first angle ranges from 50° to 90° and the second angle ranges from 0° to 40°.

2. The method of claim 1, wherein an etch rate of the inner side surface of the recess region is greater than 60% of an etch rate of the bottom surface of the recess region.

3. The method of claim 1, wherein the etch-target layer comprises a metallic element.

4. The method of claim 1, wherein the incident energy is greater than 1 keV.

5. The method of claim 1, wherein the incident energy is greater than 2 keV.

6. The method of claim 1, wherein the incident energy is greater than 5 keV.

7. The method of claim 1, wherein the inner side surface of the recess region is inclined at a third angle with respect to the top surface of the substrate, and
wherein the second angle is expressed by $\theta 2=180°-\theta 1-\theta 3$, where $\theta 1$, $\theta 2$, and $\theta 3$ denote the first, second, and third angles, respectively.

8. The method of claim 1, wherein the recess region has a width that increases in the direction away from the top surface of the substrate.

9. The method of claim 1, wherein the ion beam comprises positive ions of argon (Ar).

10. A method of fabricating a semiconductor device, comprising:
forming a magnetic tunnel junction layer on a substrate;
forming mask patterns on the magnetic tunnel junction layer; and
etching the magnetic tunnel junction layer using the mask patterns as an etch mask to form magnetic tunnel junction patterns spaced apart from each other,
wherein the etching process of the magnetic tunnel junction layer comprises irradiating the magnetic tunnel junction layer with an ion beam having an incident energy in a range from 600 eV to 10 keV;
wherein etching the magnetic tunnel junction layer comprises forming a recess region in the magnetic tunnel junction between the mask patterns; and
wherein the ion beam is incident onto a bottom surface of the recess region at a first angle with respect to a top surface of the substrate and is incident onto an inner side surface of the recess region at a second angle with respect to the inner side surface of the recess region, wherein the first angle is greater than the second angle.

11. The method of claim 10, wherein the magnetic tunnel junction layer comprises a first magnetic layer and a second magnetic layer, which are stacked on the substrate, and a tunnel barrier layer interposed between the first and second magnetic layers.

12. The method of claim 10, wherein an etch rate of the inner side surface of the recess region is greater than 60% of an etch rate of the bottom surface of the recess region.

13. The method of claim 10, wherein the inner side surface of the recess region is inclined at a third angle with respect to a top surface of the substrate, and
the second angle is expressed by $\theta 2=180°-\theta 1-\theta 3$, where $\theta 1$, $\theta 2$, and $\theta 3$ denote the first, second, and third angles, respectively.

14. The method of claim 10, wherein the ion beam comprises positive ions of argon (Ar).

15. The method of claim 10, wherein each of the magnetic tunnel junction patterns comprises a first magnetic pattern and a second magnetic pattern, which are stacked on the substrate, and a tunnel barrier pattern interposed between the first and second magnetic patterns, and
each of the first and second magnetic patterns has a magnetization direction perpendicular to an interface between the second magnetic pattern and the tunnel barrier pattern.

16. The method of claim 10, wherein each of the magnetic tunnel junction patterns comprises a first magnetic pattern and a second magnetic pattern, which are stacked on the substrate, and a tunnel barrier pattern interposed between the first and second magnetic patterns, and
each of the first and second magnetic patterns has a magnetization direction parallel to an interface between the second magnetic pattern and the tunnel barrier pattern.

17. A method of forming patterns, comprising:
forming an etch-target layer on a substrate;
forming mask patterns on the etch-target layer; and
etching the etch-target layer using the mask patterns as an etch mask to form patterns that are spaced apart from each other,
wherein etching the etch-target layer comprises irradiating the etch-target layer with an ion beam, the ion beam having an incident energy in a range from 600 eV to 10 keV;
wherein etching the etch-target layer comprises forming a recess region in the etch-target layer between the mask patterns; and
wherein the incident energy is controlled in such a way that a first etch rate of an inner side surface of the recess region is greater than 60% of a second etch rate of a bottom surface of the recess region.

18. The method of claim 17, wherein a first incidence angle of the ion beam with respect to the inner side surface of the recess region and a second incidence angle of the ion beam with respect to the bottom surface of the recess region are controlled in such a way that the first etch rate is greater than 60% of the second etch rate.

19. The method of claim 17, wherein the first incidence angle ranges from 0° to 40° and the second incidence angle ranges from 50° to 90°.

* * * * *